United States Patent [19]

Chan et al.

[11] Patent Number: 5,764,071
[45] Date of Patent: Jun. 9, 1998

[54] METHOD AND SYSTEM FOR TESTING AN ELECTRONIC MODULE MOUNTED ON A PRINTED CIRCUIT BOARD

[75] Inventors: Benson Chan, Vestal, N.Y.; Hong H. Chan, Austin; Pratap Singh, Round Rock, both of Tex.

[73] Assignee: International Business Machines Corporation, Armonk, N.Y.

[21] Appl. No.: 583,321

[22] Filed: Jan. 5, 1996

[51] Int. Cl.$^6$ ........................ G01R 31/02
[52] U.S. Cl. ........................ 324/754
[58] Field of Search ............... 324/754, 761, 324/72.5, 765, 755; 439/482

[56] References Cited

U.S. PATENT DOCUMENTS

| | | | |
|---|---|---|---|
| 4,701,696 | 10/1987 | Bogardus et al. | 324/757 |
| 4,803,424 | 2/1989 | Ierardi et al. | 324/761 |
| 4,841,241 | 6/1989 | Hilz et al. | 324/755 |
| 4,849,691 | 7/1989 | Siefers | 324/755 |
| 4,862,076 | 8/1989 | Renner et al. | 324/755 |
| 4,904,935 | 2/1990 | Calma et al. | 324/754 |
| 4,908,576 | 3/1990 | Jackson | 371/22.31 |
| 5,068,600 | 11/1991 | Hilz et al. | 324/755 |
| 5,223,787 | 6/1993 | Smith et al. | 324/758 |
| 5,317,255 | 5/1994 | Suyama et al. | 324/754 |
| 5,387,872 | 2/1995 | Nightingale | 324/538 |
| 5,418,469 | 5/1995 | Turner et al. | 324/755 |
| 5,493,230 | 2/1996 | Swart et al. | 324/754 |
| 5,574,382 | 11/1996 | Kimura | 324/754 |

*Primary Examiner*—Ernest F. Karlsen
*Assistant Examiner*—Anh Phung
*Attorney, Agent, or Firm*—Richard A. Henkler

[57] ABSTRACT

A method in system for the testing of the electrical characteristics of an electronic module mounted on a printed circuit board. The method and system monitors selected signals from the Bottom Signal Pads of the electronic module. Thus, eliminating the need for a prototype or specialized printed circuit board in order to perform desired testing of signals.

12 Claims, 3 Drawing Sheets

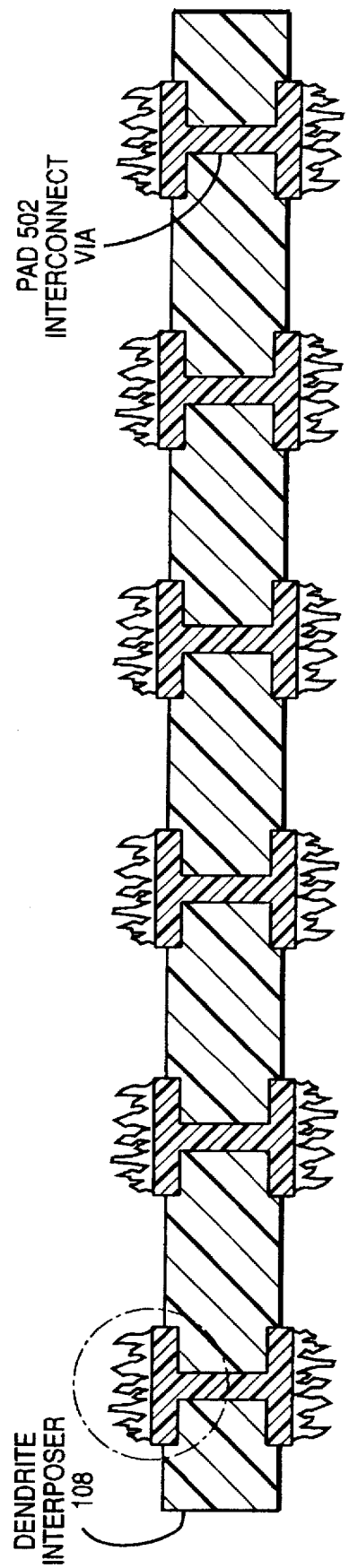
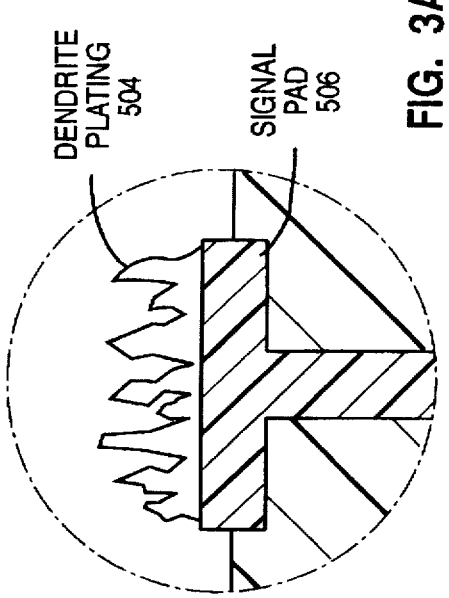
FIG. 3
FIG. 3A

METHOD AND SYSTEM FOR TESTING AN ELECTRONIC MODULE MOUNTED ON A PRINTED CIRCUIT BOARD

BACKGROUND

1. Field of the Invention

The present invention generally relates to the testing of electronic modules mounted on a printed circuit board, and more specially, to methods and systems for testing such mounted electronic modules.

2. History of the Related Art

Recently, the computer industry has expanded at an unprecedented rate. This expansion has resulted in many challenges concerning the design and testing of various circuit board designs. Currently, a variety of instruments exist that can perform diagnostics of the electrical characteristics of an electronic component (Integrated Circuit) mounted on a printed circuit board. Numerous types of equipment have been developed in order to provide connections between the instruments and the pins of the electronic component. One example is the test probe which provides an individual connection to a single designated pin. Other types of test probes include test clips which may be clipped onto integrated circuit components to form connections with multiple pins thereof. The use of these types of probes, however, has become antedated from the advancement of integrated circuits. More specifically, as integrated circuits and circuit board fabrication techniques have improved, substantially greater functionality has been incorporated into the integrated circuits. A direct result of this expanded functionality has been a significant increase in the number of pins required to effectively communicate with these integrated circuits. As the number of pins increase, the size of the pins and the spacing between the pins decreases, thereby, not unreasonably increasing the physical space required for the electronic component on a printed circuit board. For example, fine pitch solder lead integrated circuits, currently produced, generally include lead centers (pitch) as small as 0.3 millimeters (0.012 inches). The fine pitch solder lead integrated circuits cause test equipment or test probe access to become very difficult, if not impossible. Moreover, the fine pitch solder leads are delicate and more susceptible to damage by test probe connection.

One current method of resolving the above problem, uses a prototype Printed Circuit Board (PCB) with the electronic component mounted thereto, where all the pins, of the electronic component, having signals desired to be monitored, have special traces located on the PCB which terminate at a connector block used for diagnosis and monitoring. Unfortunately, this methodology may introduce undesirable electrical characteristics (noise) into the signals being tested.

It would, therefore, be a distinct advantage to have a method and system which could connect to an electronic component without the requirement of a specialized PCB, and that would not introduce undesirable electronic noise or characteristics during the testing of the electronic component. The present invention provides such a method and system.

SUMMARY OF THE PRESENT INVENTION

In one aspect, the present invention is an apparatus for testing the electrical characteristics of an electronic module mounted to a printed circuit board having a plurality of top and bottom signal pads for carrying electronic signals of the electronic module. The apparatus includes analyzing means for analyzing electronic signals received from said electronic module. The apparatus further includes connecting means for electrically connecting to each one of said bottom signal pads. The apparatus also includes means for electrically connecting to the analyzing means.

BRIEF DESCRIPTION OF THE DRAWINGS

The present invention will be better understood and its numerous objects and advantages will become more apparent to those skilled in the art by reference to the following drawings, in conjunction with the accompanying specification, in which:

FIG. 3 is a diagram illustrating in greater detail the dendrite interposers of FIG. 1 according to the teaching of the present invention.

DETAILED DESCRIPTION OF THE PREFERRED EMBODIMENT OF THE PRESENT INVENTION

Figure 1:
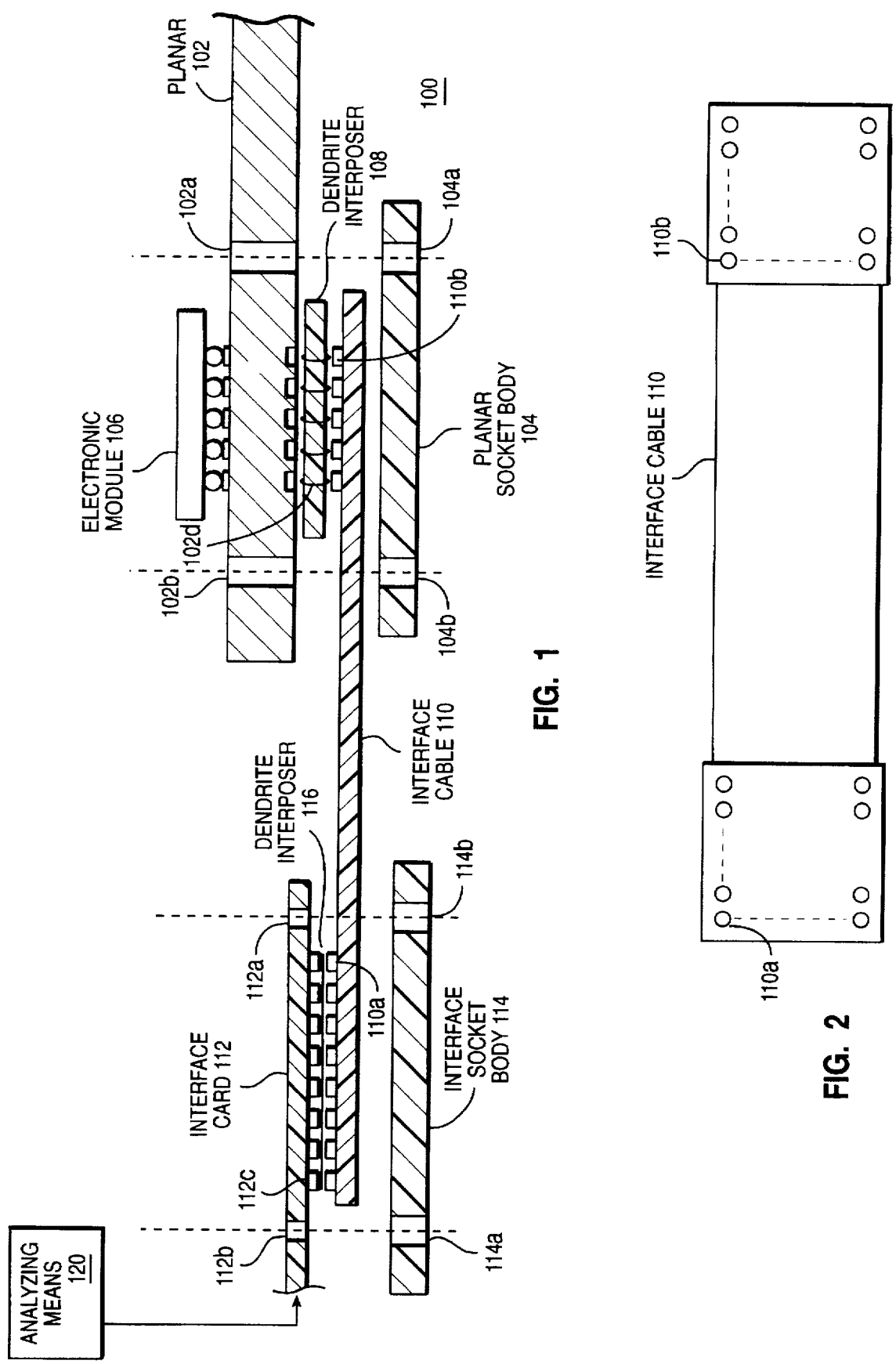
FIG. 1 is a diagram of a system for testing an electronic module 106 mounted on a planar 100 (PCB) 102 according to the teachings of the present invention.

Reference now being made to FIG. 1, a diagram is shown of the system 100 for testing an electronic module 106 mounted on a planar 100 (PCB) 102 according to the teachings of the present invention. In contrast to previous systems used for testing the electrical characteristics of the electronic module 106, the present invention uses the Bottom Signal Pads, as indicated with designation 102d, of the electronic module 106. This is accomplished by using dendrite interposers 116 and 108, planar socket body 104, interface socket body 114, and interface cable 110. A logic analyzer (not shown) uses interface card 112 having Interface Signal Pads, as indicated with designation 112c, which directly correspond to the layout and number of the Bottom Signal Pads 102d of the electronic module 106.

Interface cable 110 also includes two sets of Cable Signal Pads, as indicated with designations 110a and 110b, that also directly correspond to the layout and number of the Bottom Signal Pads 102d of the electronic module 106. Dendrite Interposers 116 and 108 are used for providing an electrical connection between the Cable Signal Pads 110a and the Interface Signal Pads 112c, and the Cable Signal Pads 110b and the Bottom Signal Pads 102d, respectively. As noted in FIG. 1, both the planar 102 and the interface card 112 have apertures 102a and 102b, and 112a and 112b, respectively.

Interface Socket Body 114 includes apertures 114a and 114b which directly correspond to apertures 112b and 112a, respectively. Through the use of appropriate means, such as nut and bolt, these apertures 112a, 112b 114a, and 114b can be employed for maintaining an electrical connection between Cable Signal Pads 110a and Interface Signal Pads 112c. Planar Socket Body 104 includes apertures 104a and 104b which directly correspond to apertures 102a and 102b, respectively. Once again, through the use of appropriated means, such as nut and bolt, these apertures 104a, 104b, 102a and 102b can be employed for maintaining an electrical connection between Cable Signal Pads 110b and Bottom Signal Pads 102d. It should be noted that the number of apertures in the interface card 112 and planar 102 directly correspond to the particular physical requirements of attaching the interface cable 110 for properly maintaining the electrical connection.

Figure 2:
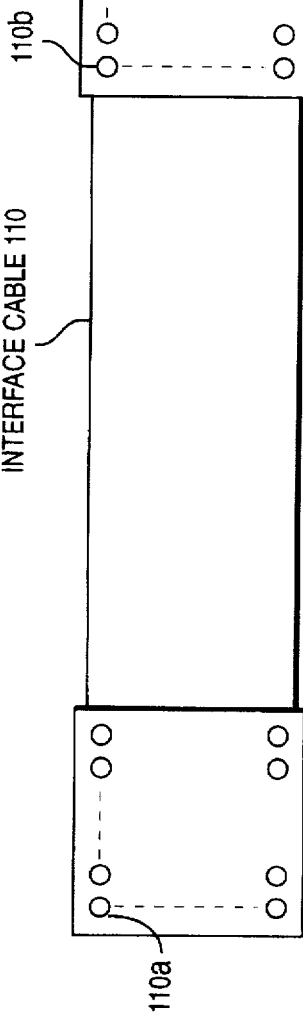
FIG. 2 is a diagram illustrating the interface cable of FIG. 1 in greater detail according to the teachings of the present invention.

Reference now being made to FIG. 2, the interface cable 110 of FIG. 1 is shown in greater detail according to the teachings of the present invention. As shown in FIG. 2, the interface cable 110 includes a total number of signal pads 110a and 110b that directly correspond to the total number of Bottom Signal Pads 102d of the electronic module 106.

Reference now being made to FIG. 3, the dendrite interposers 116 and 108 of FIG. 1 are shown in greater detail according to the teaching of the present invention. The dendrite interposer 108 is representative of interposer 116, and therefore, the explanation provided below is equally applicable to dendrite interposer 116. As shown in FIG. 3, the dendrite interposer 108 includes a plurality of signal pads 506 and dendrite plating 504, on both the top and bottom side of the dendrite interposer 108. Located between the signal pads 506 is a Pad Interconnect VIA 502. More detail concerning dendrite interposer 108 can be found in IBM Technical Disclosure Bulletin, entitled "Double-Sided, Replaceable, Dendrite-Plated Interposer for Connector Applications", Volume 37, Number 10, pages 35–36, October 1994, which is hereby incorporated by reference herein.

Figure 4:
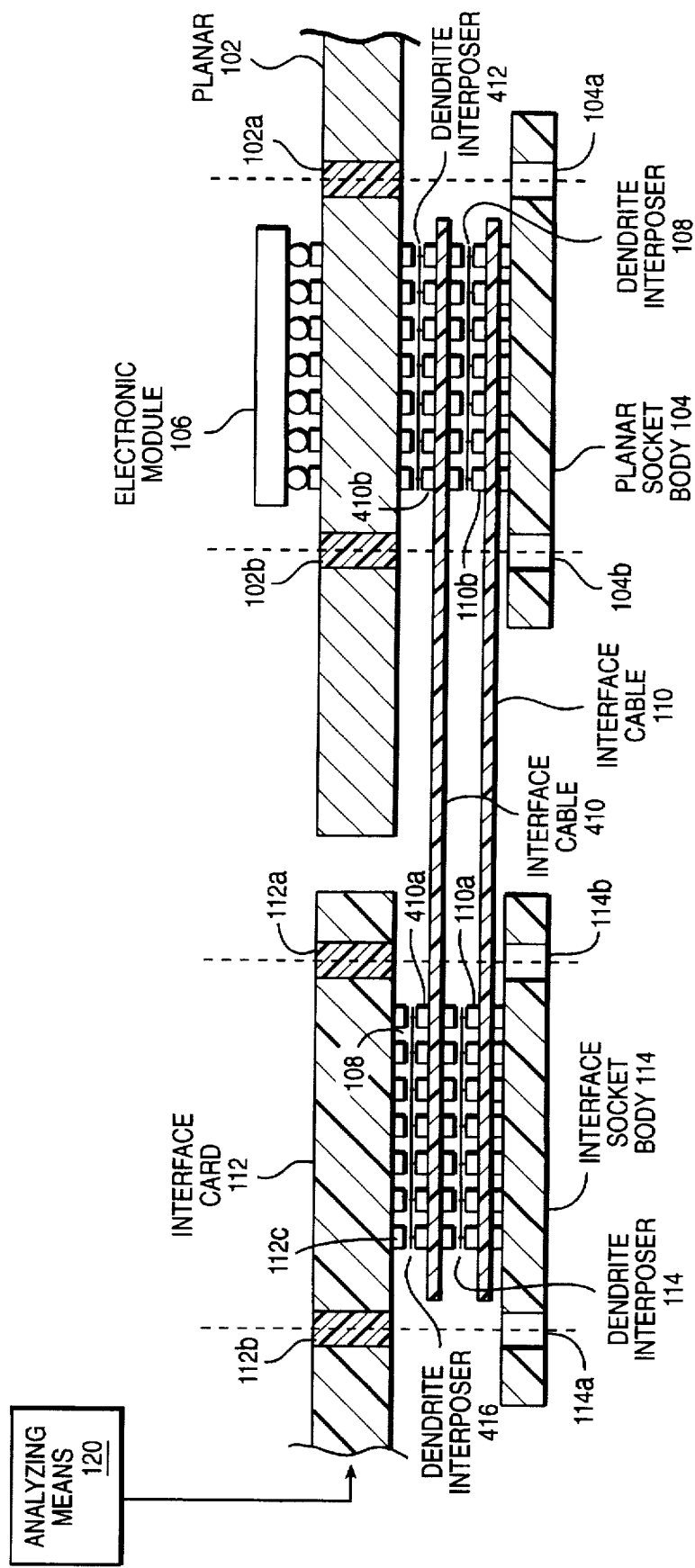
FIG. 4 is a diagram illustrating an alternative embodiment of the present invention.

Reference now being made to FIG. 4, a diagram illustrating an alternative embodiment of the present invention is presented. Due to certain considerations, such as cost and manufacturing, it may be desirable to use two or more interface cables 110 and 410 instead of one as previously explained in connection with FIGS. 1-3. Use of two or more interface cables 110 and 410 provide the ability to split up the transmission lines from the pads 110a, and 110b, to pads 410a and 410b. To accomplish this task, the cable signal pads 110a, 410a, 110b, and 410b have been extended to protrude completely through the cables 410 and 110, respectively. Thus, allowing dendrite interposers 414 and 412 to be inserted between cable pads 410a and cable pads 110a, and cable pads 410b and 110b, respectively. Thus, providing the necessary electrical connection.

It is thus believed that the operation and construction of the present invention will be apparent from the foregoing description. While the method and system shown and described has been characterized as being preferred, it will be readily apparent that various changes and/or modifications could be made wherein without departing from the spirit and scope of the present invention as defined in the following claims.

What is claimed is:

1. An apparatus for testing the electrical characteristics of an electronic module mounted to a printed circuit board having a plurality of top and bottom signal pads for carrying electronic signals of the electronic module, the apparatus comprising:

a logic analyzer for analyzing electronic signals;

an interface card for communicating received electronic signals to the logic analyzer, the interface card having a plurality of bottom interface signal pads with a one-to-one correspondence to the bottom signal pads;

an interface cable for carrying electronic signals, the interface cable having two sets of cable pads each having a one-to-one correspondence with the bottom signal pads;

a first interposer for ensuring an electrical connection between each one of the first set of cable pads and each one of the corresponding bottom signal pads;

a second interposer for ensuring an electrical connection between each one of the second set of cable pads and each one of the corresponding interface signal pads;

a first socket body for providing an upward force to the first set of cable pads and the first interposer;

a second socket body for providing an upward force to the second set of cable pads and the second interposer; and connecting means for connecting said logic analyzer to the interface cable.

2. The apparatus of claim 1 wherein the first and second interposers are composed of dendrite.

3. The apparatus of claim 1 wherein the first set of cable pads reside at one end of the interface cable, and the second set of cable pads reside at the opposite end of the interface cable.

4. The apparatus of claim 3 wherein the first set of cable pads only protrude on one surface of the interface cable.

5. The apparatus of claim 4 wherein the first and second interposers are composed of dendrite.

6. The apparatus of claim 4 wherein the second set of cable pads only protrude on one surface of the interface cable.

7. The apparatus of claim 6 wherein the first and second interposers are composed of dendrite.

8. The apparatus of claim 3 wherein the first set of cable pads protrude from both the top surface and bottom surface of the interface cable.

9. The apparatus of claim 8 wherein the first and second interposers are composed of dendrite.

10. The apparatus of claim 8 wherein the second set of cable pads protrude from both the top surface and bottom surface of the interface cable.

11. The apparatus of claim 10 wherein the first and second interposers are composed of dendrite.

12. An apparatus for testing the electrical characteristics of an electronic module mounted to a printed circuit board having a plurality of top and bottom signal pads for carrying electronic signals of the electronic module, the apparatus comprising:

a logic analyzer for analyzing electronic signals;

an interface card for communicating received electronic signals to the logic analyzer, the interface card having a plurality of bottom interface signal pads with a one-to-one correspondence to the bottom signal pads;

a first interface cable for carrying electronic signals, the first interface cable having two sets of cable pads each having a one-to-one correspondence with the bottom signal pads, each one of the cable pads protruding from both the top and bottom surfaces of the interface cable;

a second interface cable for carrying electronic signals, the second interface cable having two sets of cable pads each having a one-to-one correspondence with the bottom signal pads, each one of the cable pads protruding from both the top and bottom surfaces of the interface cable;

a first interposer for ensuring an electrical connection between each one of the first set of first cable pads and each one of the corresponding bottom signal pads;

a second interposer for ensuring an electrical connection between each one of the first set of first cable pads and each one of the corresponding first set of second cable pads;

a third interposer for ensuring an electrical connection between each one of the second set of first cable pads and each one of the corresponding interface signal pads;

a fourth interposer for ensuring an electrical connection between each one of the second set of first cable pads and each one of the corresponding second set of second cable pads;

a first socket body for providing an upward force to the first set of first cable pads, the first set of second cable pads, and the first and second interposers;

a second socket body for providing an upward force to the second set of first cable pads, the second set of second cable pads, and the third and fourth interposers; and connecting means for connecting said logic analyzer to the interface cable.

* * * * *

UNITED STATES PATENT AND TRADEMARK OFFICE
CERTIFICATE OF CORRECTION

PATENT NO : 5,764,071
DATED : June 9, 1998
INVENTOR(S) : Chan et al

It is certified that error appears in the above-identified patent and that said Letters Patent is hereby corrected as shown below:

Column 2, line 33, please delete "100";
Column 2, line 39 - 40, please delete "A logic analyzer (not shown)" and insert
-- Analyzing means 120 (e.g. a Logic Analyzer)--.

Signed and Sealed this

Second Day of February, 1999

*Attest:*

*Attesting Officer*

*Acting Commissioner of Patents and Trademarks*